US006992352B2

(12) United States Patent
Lai et al.

(10) Patent No.: US 6,992,352 B2
(45) Date of Patent: Jan. 31, 2006

(54) TRENCHED DMOS DEVICES AND METHODS AND PROCESSES FOR MAKING SAME

(75) Inventors: Tommy Mau Lam Lai, Hksar (CN); Johnny Kin On Sin, Hksar (CN)

(73) Assignee: Analog Power Limited, Hong Kong (CN)

( * ) Notice: Subject to any disclaimer, the term of this patent is extended or adjusted under 35 U.S.C. 154(b) by 0 days.

(21) Appl. No.: 10/441,018

(22) Filed: May 20, 2003

(65) Prior Publication Data

US 2004/0232482 A1 Nov. 25, 2004

(51) Int. Cl.
*H01L 29/76* (2006.01)

(52) U.S. Cl. .................. 257/335; 257/329; 257/331; 257/341

(58) Field of Classification Search ............... 257/332, 257/335, 339, 401, 409, 491, 500, 341, 50
See application file for complete search history.

(56) References Cited

U.S. PATENT DOCUMENTS

| 5,316,959 A | 5/1994 | Kwan et al. |
| 5,468,982 A | 11/1995 | Hshieh et al. |
| 5,474,943 A | 12/1995 | Hshieh et al. |
| 5,578,851 A | 11/1996 | Hshieh et al. |
| 5,877,528 A | 3/1999 | So |
| 5,904,525 A | 5/1999 | Hshieh et al. |
| 6,469,345 B2 * | 10/2002 | Aoki et al. .................. 257/330 |
| 6,518,127 B2 * | 2/2003 | Hshieh et al. .............. 438/270 |
| 6,720,616 B2 * | 4/2004 | Hirler et al. ................ 257/330 |

* cited by examiner

*Primary Examiner*—Long Pham
*Assistant Examiner*—Wai-Sing Louie
(74) *Attorney, Agent, or Firm*—Buchanan Ingersoll PC

(57) ABSTRACT

This invention describes a process for making a high density trench DMOS (Double-diffused Metal Oxide Semiconductor) transistor with improved gate oxide breakdown at the three-dimensional trench corners and better body contact which can improve the latch-up immunity and increase the drive current. A guard-ring mask is used to define a deep body to cover the three-dimensional trench corners, which can prevent early gate-oxide breakdown during the off-state operation. Another function of the guard-ring mask is to define self-aligned deeper trenches at the terminations of the trenches. The deeper trenches at the terminations of the trenches will result in thicker gate oxide grown at the terminations. This layer of thicker oxide is used to prevent the pre-mature gate oxide breakdown at the three-dimensional trench corners. A trench spacer is formed after the N-body drive-in step by depositing a layer of oxide and then followed by an oxide etch-back step. This spacer is used to prevent any unwanted impurities to penetrate through the trench sidewall and get into the device channel during the high dosage source implantation step.

9 Claims, 10 Drawing Sheets

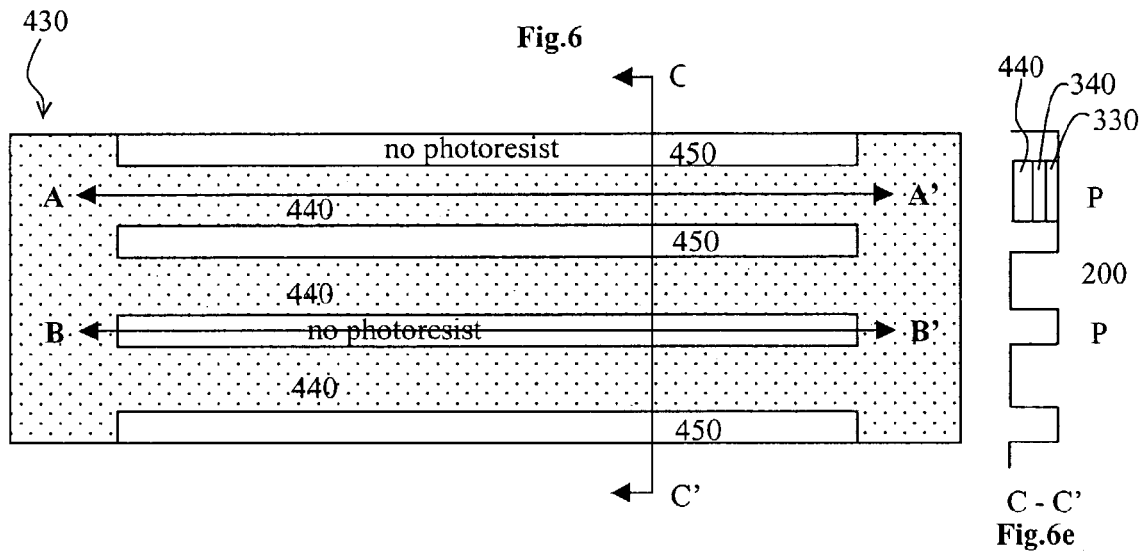
Fig.6
Fig.6e
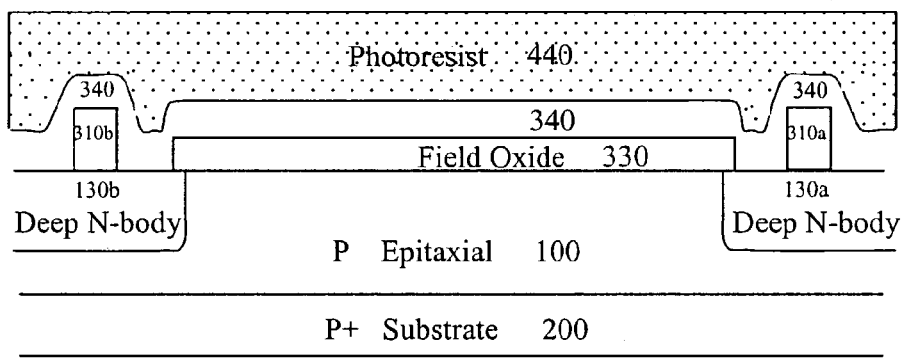
Fig.6a
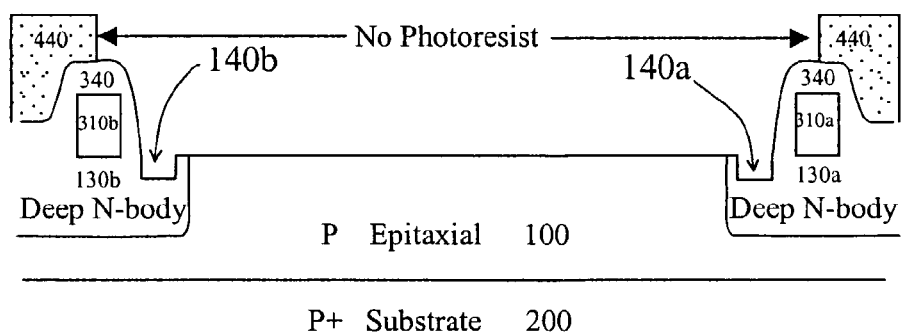
Fig.6b

TRENCHED DMOS DEVICES AND METHODS AND PROCESSES FOR MAKING SAME

FIELD OF THE INVENTION

This invention relates to trenched DMOS devices and processes and methods for making same. More particularly, this invention relates to high density trenched DMOS semiconductor devices, such as high density DMOS transistor cells, with improved gate oxide breakdown performance and methods and processes for making same. This invention also relates to trenched DMOS semiconductor devices with enhanced on-resistance performance and methods and processes for making same. This invention further relates to trenched DMOS semiconductor devices with means, processes and methods to enhance cell pitch miniaturization. This invention yet further relates to trenched DMOS semiconductor devices with means, methods and process to improve yield.

BACKGROUND OF THE INVENTION

Double-diffusion metal oxide semiconductor (DMOS) transistors are a type of metal-oxide-semiconductor field effect transistors (MOSFETs) which are commonly used as power transistors. For example, DMOS power MOSFETs are widely used as power switching means in, for example, portable devices, automotive electrical systems and electronics, power supplies and power management systems, for controlling power flow from the power source to the load. One of the most fundamental requirements of a switching means is having very low power loss during power transferral between the power source and the load. To fulfil this requirement, it is highly desirable if the on-resistance of a DMOS power MOSFET can be made as low as possible.

A power MOSFET is usually formed by connecting a plurality of MOSFET cells in parallel for power applications such as high current switching applications. Parallel connection of the transistor cells enhances the current rating as well as reducing the on-resistance.

Trenched DMOS technology is common employed in the fabrication of DMOS power MOSFET devices for, for example, compact design. In the current trenched DMOS technology, a transistor is usually formed from square cells, hexagonal cells and strip cells. The square cell is commonly used to provide a compact design with a cell pitch of larger than 2.0 $\mu$m and with a trench width of about 1.0 $\mu$m. The strip cell design is commonly used when a higher cell density is required in order to reduce the on-state resistance. Examples of prior art trenched DMOS technology have been described in U.S. Pat. Nos. 5,341,011, 5,468,982, 5,474,943, 5,578,851, 5,877,528 and 5,904,525 which are incorporated herein by reference.

A trenched DMOS transistor cell is characterized by a trench which is formed in the substrate and which is lined with a thin oxide layer and then filled with a conductive polysilicon to form the transistor gate structure. In prior art trenched DMOS power MOSFET transistors, gate oxide breakdown is always a cause of device failure or premature damage which usually occurs during transistor switching. Hence, it is highly desirable if there can be provided trenched DMOS MOSFET devices with improved gate oxide breakdown performance as well as methods and processes for making same.

As the on-state resistance can be reduced by increasing the number of parallelly connected transistor cells and, to meet the requirements of a compact design, a high cell density is highly desirable. As cell density is largely determined by the cell pitch, it is therefore highly desirable if the cell pitch can be reduced or minimized. While the strip cell design is always used for high-density and compact transistor design, it is known that the minimum cell pitch is often limited by the lateral diffusion of source impurities into the device channel which will adversely affect the channel impurity concentration, thereby affecting the threshold voltage. In addition, it is known that the conventional strip cell design does not provide very good body contact which can degrade the on-state device performances such as current drive and latch-up immunity.

Furthermore, excessive polysilicon recesses in the trench, which results in a difference in height between the top surface of the polysilicon filling in the trench and the silicon substrate surface, may result in excessive threshold voltage variation due to undesirable penetration of impurities through the trench sidewalls into the device channel. This undesirable phenomenon is usually a result of conventional mass production processes and can hardly be avoided when conventional production processes are employed. Hence, it is highly desirable if undesirable penetration of impurities through the trench sidewall into the device channels can be prevented or, at least, alleviated for improved control of threshold voltage.

OBJECT OF THE INVENTION

Accordingly, it is an object of the present invention to provide trenched DMOS MOSFET transistors and devices with improved or enhanced gate oxide breakdown performances.

It is also an object of this invention to enhance trenched DMOS cell density by reducing the minimum cell pitch of the strip cell design.

It is a further object of this invention to provide means, methods and process to alleviate the undesirable variation of threshold voltage of the design by preventing or, at least, limiting or alleviating undesirable penetration of source impurities through the trench sidewall into the device channel.

It is yet a further object of the present invention to provide trenched DMOS MOSFET transistors and devices with enhanced strip cell design to improve the body contact, thereby improving the on-state device performances.

Broadly speaking, since each additional masking step usually requires an additional mask alignment process which may result in additional costs and alignment error, it is also an object of the present invention to achieve the above objectives by relative simple means and with minimal number of masking steps.

It should be noted that the above objects are each to be read disjunctively with the minimum objective of providing the public with a useful choice.

SUMMARY OF THE INVENTION

Upon examination of the cause of failure of prior art DMOS transistors, it is noted that early gate oxide breakdown always occurs at the corner regions, especially the sharp corner regions. It is further noted that the thickness of the gate oxide layer is thinner at such corners, especially end corners, as a result of gate oxide growth by conventional fabrication process. To alleviate this problem, there is provided in the present invention an enhanced DMOS semiconductor device including a plurality of DMOS transistor cells, said DMOS transistor cell being formed on a substrate of a first conductivity type and including a body-region of a second conductivity type, said transistor cell include a trench formed on said substrate and having a first end, a second end and a middle portion interconnecting said first end and said second end, the bottom surface of said first and second ends being below the bottom surface of said middle portion of said trench. In the present specific example, the substrate is P+ doped and the first conductivity type is therefore P-type.

Hence, according to the present invention, there is provided a DMOS semiconductor device including a plurality of DMOS transistor cells, said DMOS transistor cell being formed on a substrate of a first conductivity type and including a body-region of a second conductivity type, said transistor cell include a trench formed on said substrate and having a first end, a second end and a middle portion interconnecting said first end and said second end, the bottom surface of said first and second ends being below the bottom surface of said middle portion of said trench.

In a preferred embodiment, said trench being substantially covered with a layer of insulating substance and said layer of insulating substances being sandwiched between a layer of conductive substance and the bottom and side surfaces of said trench, the layer of insulating substance at said first and second ends of said trench being thicker than that along said middle portion of said trench.

Preferably, said conductive substance includes polysilicon and said insulating substance includes an insulative oxide, nitride or like substance.

Preferably, the thickness of said insulative layer at said first and second ends of said trench exceeds that of the shallower middle portion of said trench by at least 400 Å.

Preferably, a first and a second islands are formed respectively adjacent to said first and said second ends of said trench, said trench being intermediate of said first and said second islands.

Preferably, said first and said second islands protrude above said trench and said body-region.

Preferably, said first and said second islands being separated from said trench by said body-region.

Preferably, said first and said second islands being formed from an insulating oxide.

Preferably, said first and said second ends of said trench being at least about 400 Å deeper than the depth of the shallower middle portion of said trench.

In another aspect of the present invention, there is provided A process of forming a DMOS semiconductor device including a plurality of DMOS transistor cells, said DMOS transistor cell being formed on a substrate of a first conductivity type and including a body-region of a second conductivity type, said transistor cell include a trench formed on said substrate and having a first end, a second end and a middle portion interconnecting said first end and said second end, the bottom surface of said first and second ends being below the bottom surface of said middle portion of said trench, said method includes the sequential steps of:

forming a first insulating layer of a first thickness on the surface of said substrate, separating a first and a second islands from said first insulating layer by selective masking and etching of said insulating layer so that the portion of said substrate between said first and said second islands and the remaining portion of said insulating layer being exposed after said selective etching, forming a body-region of a second conductivity type around said first and said second islands, forming a second insulating layer covering said first island, said second island and the remaining portion of said first insulating layer, said second insulating layer including a depression at the locations corresponding to the exposed substrate between said remaining portion of said first insulating layer and said islands, etching away said remaining portion of said first insulating layer and said second insulating layers and a portion of said body-region, resulting in a trench with said first and said second ends depressed below said middle portion of said trench, covering said trench with a layer of insulating substance, the insulating layer at said first and said second ends of said trench being thicker than that at the middle portion of said trench, covering said insulating layer with a layer of conductive substance.

Preferably, the step for forming said trench being aligned with reference to said islands.

Preferably, said second insulating layer includes a hard mask oxide layer by plasma enhanced chemical vapour deposition (PECVD).

Preferably, said insulating layer include an oxide, such as silicon oxide, a nitride or like insulating substances.

Preferably, the step of covering said trench with a layer of insulating substance includes the sequential steps of:

growing a layer of sacrificial oxide to repair possible damage of said trench during etching and to round the corners of said trench, stripping said sacrificial oxide layer, depositing an oxide layer to fill up said trench, removing the oxide deposited along the shallower middle portion of said trench, forming gate oxide along the entire length of said trench.

Preferably, said deposition of said oxide layer in the third step being by low-pressure chemical vapour deposition (LPCVD).

According to a third aspect of the present invention, there is provided a trenched DMOS semiconductor including a plurality of DMOS transistor cells, said DMOS transistor cell being formed on a substrate of a first conductivity type and including a body-region of a second conductivity type, said transistor cell include a trench formed on said substrate and having a first end, a second end and a middle portion interconnecting said first end and said second end, said trench including sidewalls extending from the bottom surface of said trench, said trench being substantially covered with a layer of conductive substance, a layer of insulating substance being deposited between said layer of conductive substance and said substrate, the top surface of said layer of conductive substance being recessed from the top of said trench which is adjacent to the top surface of said substrate, the portion of said sidewalls between said top surface of said layer of conductive substance and said top surface of said substrate being substantially covered with spacing means.

In a preferred embodiment, said conductive substance includes polysilicon, said insulating substance includes an oxide and said spacing means include a layer of oxide.

Preferably, said oxide includes a LPCVD oxide.

Preferably, the depth of said recess is in the region of 1,000 Å to 3,000 Å and the thickness of said spacing means being in the region of 1,000 Å to 2,000 Å.

Preferably, the depth of said recess is in the region of 1,500 Å and the thickness of said spacing means is in the region of 1,500 Å.

According to a fourth aspect of the present invention, there is provided said spacing means being formed along the sidewall portion of said recess before impurities of said first conductivity type is introduced in the body-region of said second conductivity type.

Preferably, said spacing mean is formed by depositing a layer of insulating substance on the top surface of the semi-processed device after said trench has been covered with said conductive substances, said layer of insulating substance being etched back to form said spacing means.

Preferably, said spacing means is formed after impurity of said second conductivity type has been introduced into said substrate to form said body-region.

Preferably, said body-region is of the N-type and said substrate is of the P-type.

According to a fifth aspect of the preferred embodiment, there is provided a DMOS semiconductor device including a plurality of DMOS transistor strip cells, said DMOS transistor strip cell being formed on a substrate of a first conductivity type and including a body-region of a second conductivity type, said transistor cell include an elongated trench formed on said substrate, said transistor cell includes an elongated strip of said first conductivity type forming the source region, said elongated source region strip extending adjacent to and along said elongated trench, said device includes an elongated body-region contact strip of the second conductivity type, the length of said body contact strip being comparable to that of said elongated source region strip.

In a preferred embodiment, said device including metallized contact extending substantially along the entire length of said elongated source region strip and substantially along the entire length of said body-region contact strip.

Preferably, the width of said body-region contact strip being in the region of 0.1 to 0.3 μm.

Preferably, said body-region strip is of N-type conductivity and said source region being of P-type conductivity.

Preferably, said metallized region being substantially elongated and the overall width of said metallized region overlying said strip body contact region and strip source region does not exceed 0.5 μm.

According to yet another aspect of the present invention, there is provided a process of forming a DMOS device, especially a DMOS device according to the fifth aspect of this invention, including the step of:

forming spacing means in the contact holes before forming the body-region contact strip.

Preferably, said process further includes the step of:

removing said spacing means after said body-region contact strip has been formed.

Preferably, said spacing means being formed by depositing spacing medium in the said contact holes and forming said spacing means by etching back.

Preferably, said spacing medium includes nitride, oxide or like substances.

Preferably, said spacing medium is deposited after contact holes have been formed through a layer of interlayer dielectric deposited on the semi-processed substrate.

BRIEF DESCRIPTION OF THE DRAWINGS

Preferred embodiments of the present invention will be explained in detail below by way of examples and with reference to the accompanying drawings, in which:

FIGS. 1–5, FIGS. 6a, 6b to 9a and 9b are the longitudinal cross-sectional views of a portion of a semiconductor substrate showing the process steps for the fabrication of a first embodiment of a DMOS device with improved gate oxide performance, FIG. 6 shows the top plan view of the semi-processed substrate of FIGS. 6a and 6b, FIG. 6e is a cross-sectional view of the substrate of FIG. 6 along the line C–C', FIGS. 6a, 7a, 8a and 9a being the longitudinal views along the section A–A', FIGS. 6b, 7b, 8b and 9b being the longitudinal views along the section B–B'.

DETAILED DESCRIPTION OF THE PREFERRED EMBODIMENTS

Referring generally to FIGS. 1–22, a DMOS transistor device is to be formed on a P+ substrate 200 on which a P epitaxial layer 100 is supported. The DMOS transistor includes a plurality of transistor cells formed in the active core cell area 320. Each transistor cell includes a deeper vertical N-body region 130 which encloses a P+ source region. The transistor cells are connected in parallel to reduce the on-resistance and to handle large current applications. The drain electrode for the DMOS transistor is formed conventionally on the bottom free surface of the P-substrate 200. The DMOS transistor includes a trenched gate structure in which a trench is formed in the P epitaxial layer 100. The trench is lined with a thin oxide layer and then filled with a conductive polysilicon layer to form the transistor gate structure.

Figure 22:
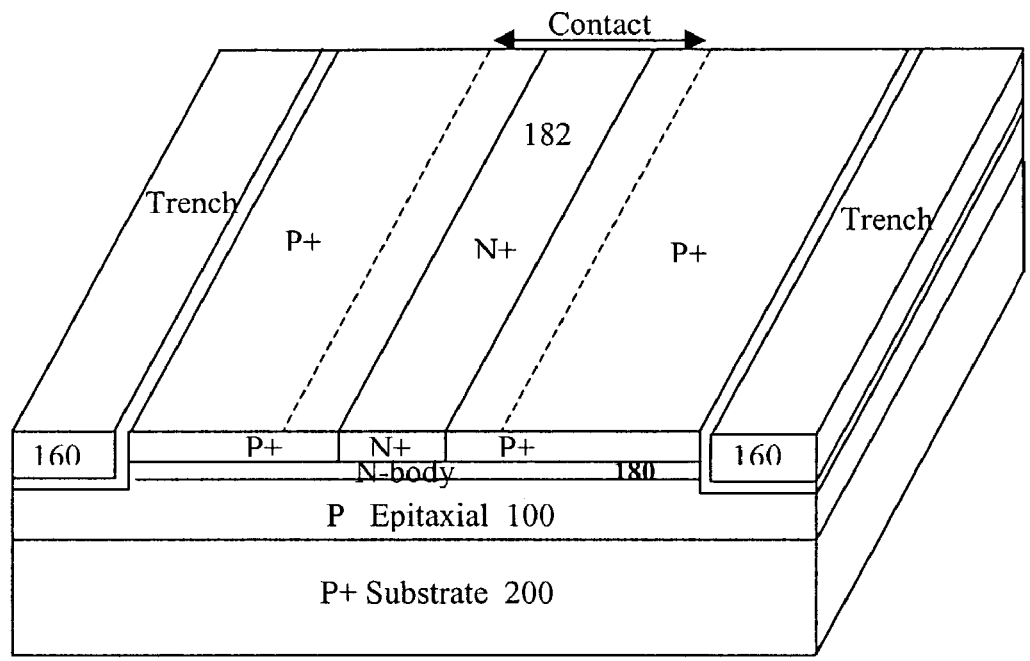
FIG. 22 shows, in a perspective view, a trenched DMOS device with strip cells and elongated body region contact of the embodiment of FIGS. 18–21.

As can be seen from FIG. 22, the trench is formed between the P+ source regions of adjacent transistor cells. The DMOS transistor also includes a N+ region formed between the P+ source regions to provide a body contact with a metallic conductive layer.

When referring to the Figures, it should be understood that only a portion of the device or the semi-processed device and only a few of the transistor cells are shown to assist understanding. Of course, a complete transistor will include more cells than those shown in the Figures. Furthermore, in most of the Figures, only the substrate, the doped regions, the oxide and the polysilicon layers which are relevant to the processing steps of the present invention are shown. The other features, for example, metallization and intercell contacts will be understood by persons skilled in the art.

Referring to FIGS. 1–9b, the processing steps which are suitable for manufacturing the DMOS power MOSFET device with improved gate oxide performance at the trench corners, especially the three-dimensional trench corners, are described.

Figure 1:
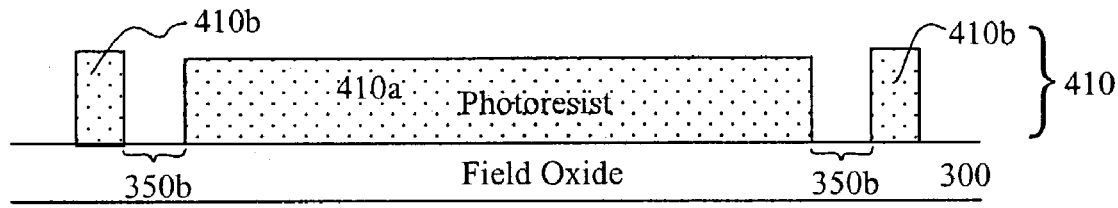
Figure 1A:
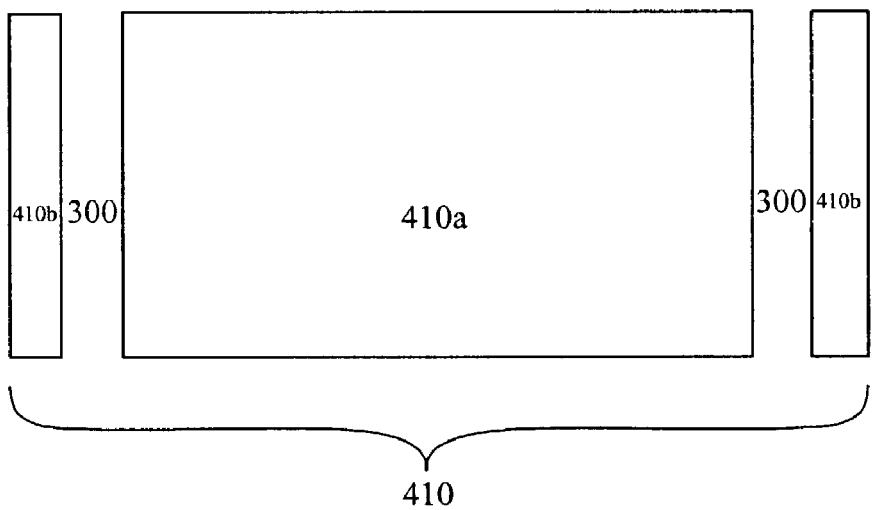
FIG. 1a shows the plan view of FIG. 1.

Referring to FIG. 1, the processing steps begin by growing a P doped epitaxial layer 100 on a P+ doped substrate 200. The P epitaxial layer 100 typically has a resistivity of between 0.1 and 5.0 ohm-cm. Of course, the thickness and the resistivity of the P epitaxial layer can be determined by a person skilled in the art with reference to the device requirements for the on-resistance and the breakdown voltage. In this preferred example, the thickness of the P epitaxial layer 100 is about 3 μm–20 μm.

Figure 2:
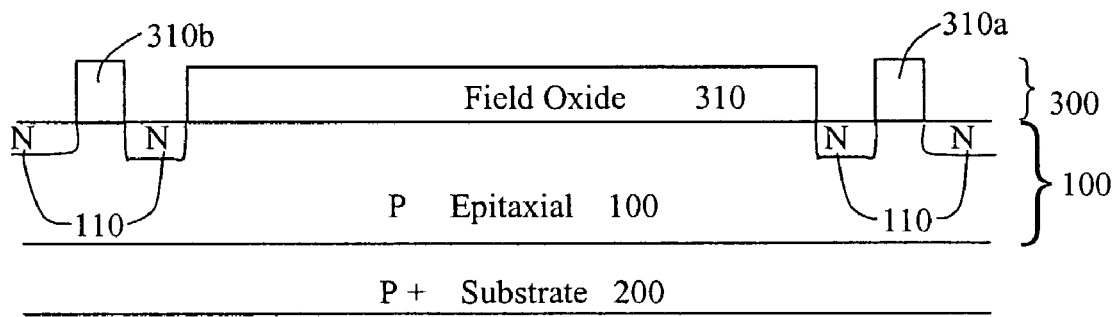

An initial oxidation process is performed to form a thick layer of thermal oxide 300 on top of the P epitaxial layer as field oxide. The initial layer of thermal oxide 300 has a typical thickness of between 4,000–10,000 Å and is 6,000 Å for the present example. A first masking layer 410 is then employed to define the N-doped body-region as well as the width and location of the active regions in which the gate trenches are to be formed. This first masking layer 410 is substantially a guard-ring mask including a central portion 410a which defines the active regions and the peripheral regions 410b which define oxide islands 310a and 310b as shown in FIG. 2. The peripheral regions 410b include elongated strips which are generally orthogonal to the longitudinal axis of the gate trenches as shown in the trenched masking pattern of FIG. 6. The elongated oxide island forming strips 410b are separated from the main active region formation mask 410a, thereby exposing an elongated strip of the thermal oxide 300 at the region separating the peripheral region 410b and the main masking region 410a.

Referring to FIG. 2, the field oxide layer 300 can be etched, for example, by anisotropic etching and a thin layer of pad oxide of about 200 Å can be grown as a protective layer during the guard-ring implantation. The thermal oxide layer 300 was selectively etched so that the portion of the field oxide 310 corresponding to the active regions remain and oxide islands 310a and 310b are formed. These oxide islands 310a and 310b are formed at the locations immediately adjacent to the extreme ends of the gate trenches to be formed. In addition, the oxide islands 310a and 310b protrude above the epitaxial layer and appear like an island surrounded by a sea of the N-doped body-region and are therefore conveniently named "oxide islands". The oxide islands 310a and 310b can be used as alignment means for defining the location of the gate trenches using trench pattern masking and, to some extent, facilitating a substantially self-aligned process and allowing higher tolerances. After the oxide islands 310a and 310b have been formed, N-typed impurity is implanted through the protective pad oxide layer to reach the silicon substrate surface to form part of the deep N-body regions. The N-type impurity implantation can, for example, be carried out with phosphorous ions at 60–100Kev and with an ion beam of $2 \times 10^{13}$ (2E13) to $2 \times 10^{14}$ (2E14) flux density to form the initial deep N-body-region 110 as shown in FIG. 2.

Figure 3:
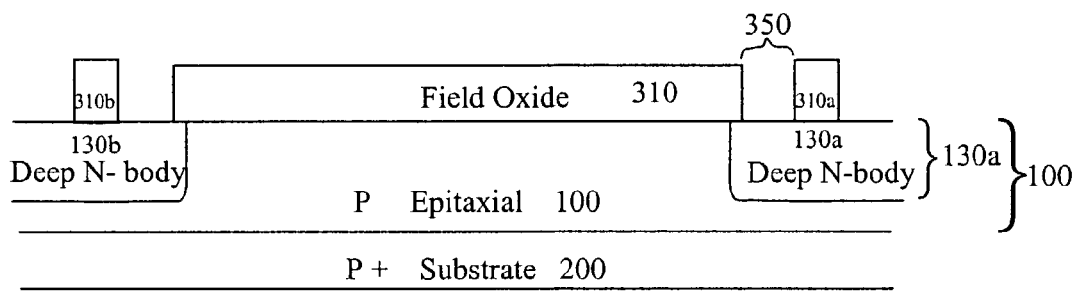

A deep N-body diffusion process is then carried out using a long thermal cycle to drive the impurity to a certain depth to form the complete deep N-body regions 130a and 130b as shown in FIG. 3. The depth of the deep N-body is usually around 1.0–2.0μm and is around 2.0 μm for the present example. As can be seen from FIGS. 6b, 7b and 8b, the depth of the deep N-body regions 130a and 130b is deeper than the maximum trench depth.

Figure 4:
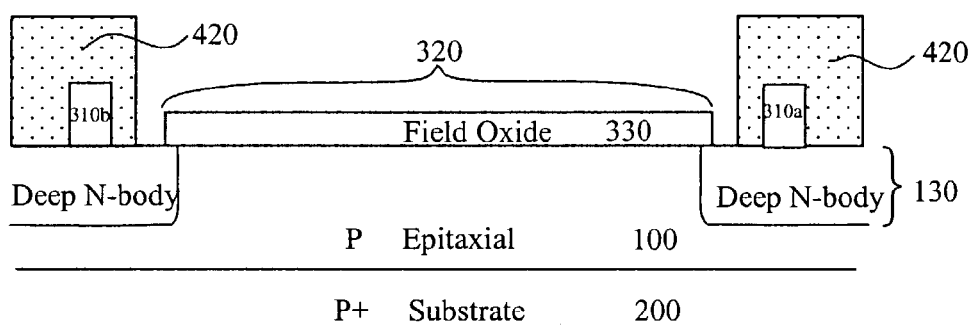

A second masking layer 420 or the field termination mask, is used to thin down the field oxide in the active area 320 to an appropriate thickness to form the active area oxide 330 as shown in FIG. 4. The layer of the thermal oxide 310 can be thinned down to become the active area field oxide of an appropriate thickness by dry etching process. The thickness of this active area field oxide 330 is typically in the region of 2,000 Å to 3,000 Å. As the oxide islands 310a and 310b are covered by the second masking layer, the thickness or height of the oxide islands are therefore substantially unchanged.

After the field oxide in the active area has been thinned down appropriately, a layer of hard mask oxide 340 is deposited. This hard mask oxide 340 can, for example, be a layer of plasma enhanced chemical vapour deposition (PECVD) with a thickness of around 6,000 Å.

Figure 5:
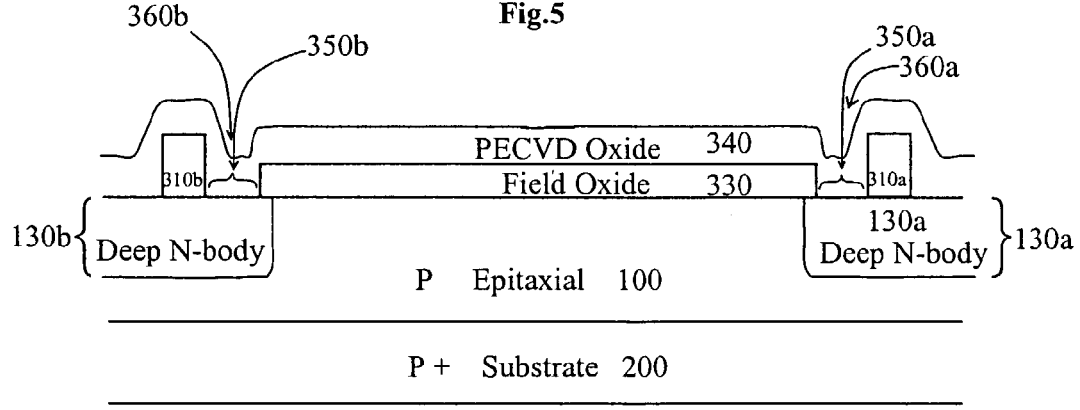
Figure 7A:
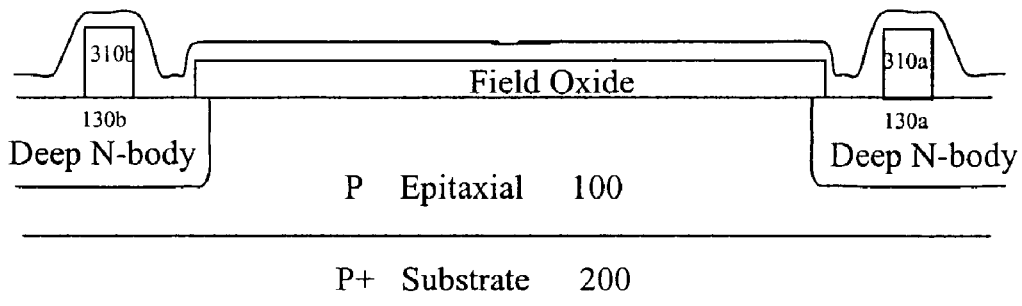
Figure 7B:
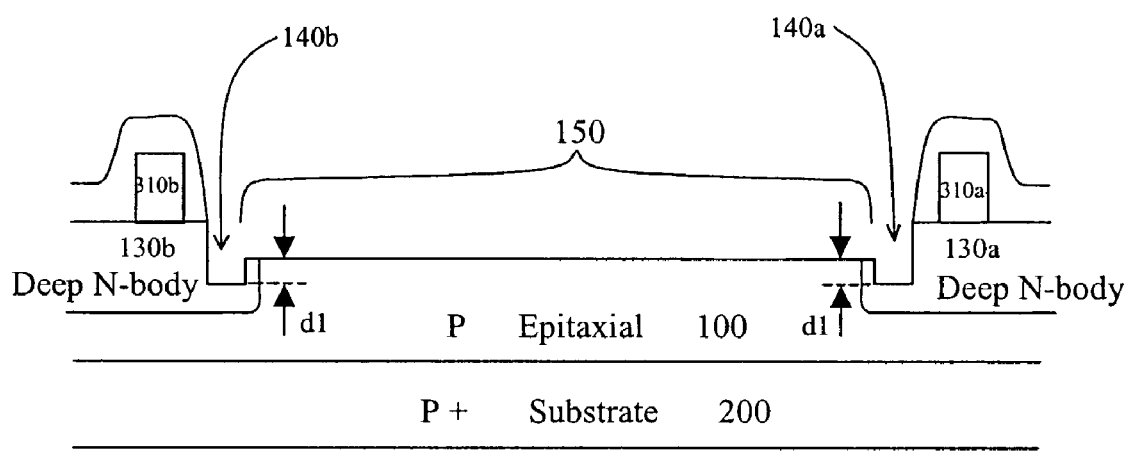

Referring to FIG. 5, it will be noted that after the PECVD hard mask oxide has been deposited, there are three different levels of oxide layers with different thickness, namely, the oxide islands 310a or 310b plus the PECVD oxide layer 340, the field oxide layer 330 plus the PECVD oxide layer 340, and the PECVD oxide alone in the 350 region. As the thinned down active area field oxide 330 and the oxide islands are separated by air gaps 350a and 350b, depressed portion 360a and 360b will be formed on the PECVD oxide layer 340 corresponding respectively to the air gaps portion 350a and 350b. The trench pattern mask for defining the individual gate trenches will be applied next.

In FIG. 6, there is shown the plan views of an example trench pattern mask for use in the present example. In the following, FIGS. 6a, 7a, 8a and 9a show the side elevation cross-sectional views along the sectional line A–A' showing the various changes occurred during the fabrication steps. FIGS. 6b, 7b, 8b and 9b show the side elevation cross-sectional view along the sectional line B–B' during the various fabrication steps.

Referring to FIG. 6, the trench pattern mask is used to define the width of the trenches and the separation between adjacent trenches. The trench mask pattern 430 includes regions with photo-resist 440 corresponding to separation between adjacent trenches and regions with no photo-resist 450 corresponding to the trenches. As the width and separation of the trenches are defined by this mask pattern and because of the deposition of the oxide islands 310a and 310b at the extreme longitudinal ends of the trench forming region, a slight shift or mis-alignment of the trench masking step will not have any significant impact to the width and location of the deep trenched regions at the extreme ends of the trench, thereby improving yield.

FIGS. 6a and 6b show the side elevation view respectively along the sectional lines A–A' and B–B' after the trenched layer mask has been applied to the semi-processed substrate of FIG. 5. After the trench pattern mask has been applied, the unmasked portions of the hard mask oxide layers 330, 340 are completely removed, for example, by anisotropic etching. As the spacings 350 between the oxide islands 310a and 310b and the active region field oxide layer 330 is only filled with the hard mask PECVD oxide 340, the total thickness of the oxide at this depressed regions 360a and 360b will be significantly less than that at the active regions and the oxide islands. When the un-masked hard mask oxide layers 330 and 340 in the active regions have been completely removed, a portion 140a and 140b of the silicon substrate or, more precisely, portions of the N-body region 130a, 130b, are also removed, thereby forming two depressed regions 140a and 140b at locations corresponding to the ends or terminations of the gate trenches.

After the trench formation hard mask etching process has been completed, the photo-resist is stripped off and further etching on the substrate is carried out to etch away the silicon substrate until trenches of the required trench depth have been formed. The usual range of trench depth is in the region of 1.0 to 2.0 μm and the trench depth of the present example is around 1.5 μm. As can be seen from FIG. 7b, the depths of the trenches at the end or terminations (140a, 140b) of the trenches are deeper than the portion of the trench which is intermediate of the extreme ends or terminations. The extra depths d1 at the trenched end or termination is preferably at least 400 Å–500 Å, although a higher thickness will provide a better oxide breakdown performance. After the silicon substrate has been etched to form the trenches, a layer of sacrificial oxide is grown along the trenches to remove damage to the trench during the silicon substrate etching and to smoothen or round the trench corners.

Figure 8A:
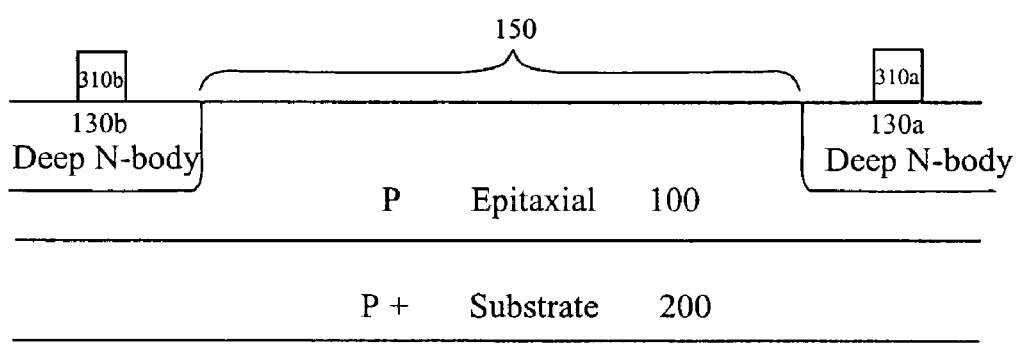
Figure 8B:
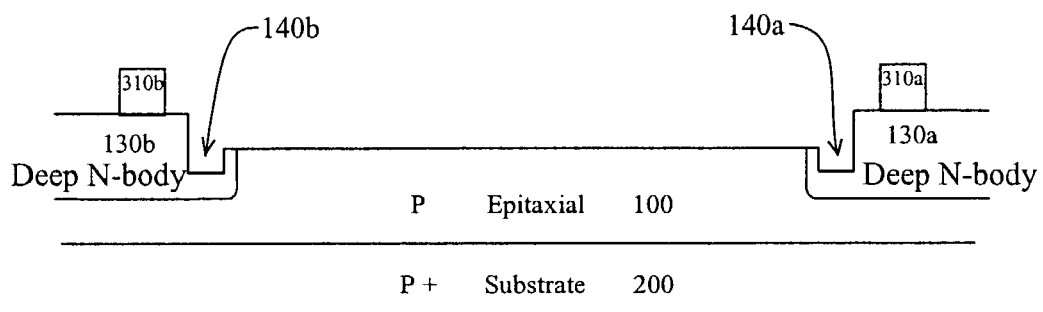
Figure 9A:
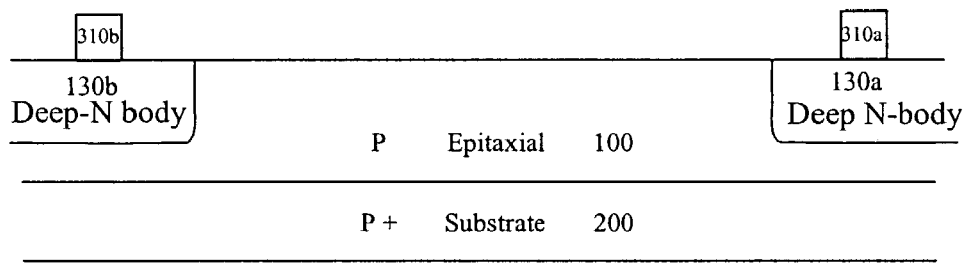
Figure 9B:
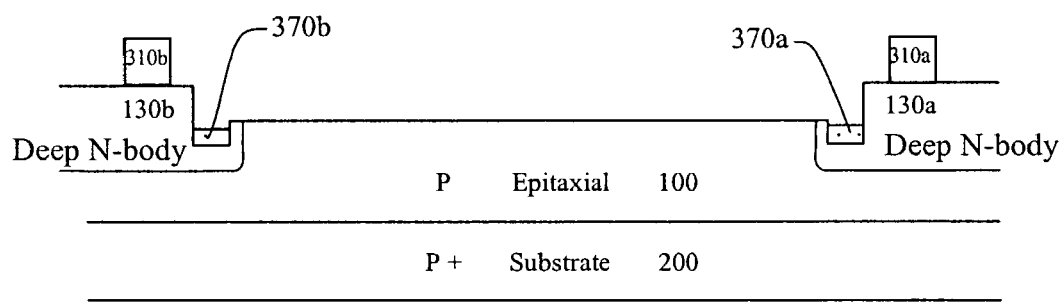

FIGS. 8a and 8b show the side elevation views of the semi-processed substrate respectively along the sectional lines A–A' and B–B' after the sacrificial oxide growth and its subsequent removal. A layer of insulating substance is next deposited to fill up the trenches. This insulating substance can, for example, be a low-pressure chemical vapour deposition oxide (LPCVD). Another etching process, for example, a wet etching process, is used to remove the oxide from the shallower region of the trench while keeping oxide of an appropriate thickness at the trenched ends or terminations which are depressed with respect to the shallower region of the trench interconnecting the trenched ends. The thickness of the oxide 370a, 370b is about the depth of the depression of the trenched ends or terminations in this example. In general, the thickness of this extra oxide filling is preferably in the region of 1,000 Å–2,000 Å and the thickness of this trench end oxide layers is approximately 1,500 Å in this example. Next, to form the gate oxide lining, a thin oxide layer is grown. This gate oxide layer 390 has a typical thickness of about 500 Å, although other thickness can be used as appropriate. As noted from FIGS. 9a and 9b, it will be noted that the trench termination or ends is formed with a thicker gate oxide 370a and 370b to enhance the gate oxide breakdown performance of a power MOSFET device at the trench corners, especially the three-dimensional trench corners, during switching applications.

After the thin layer of gate oxide lining has been applied onto the trenched surface, the trench is next filled with a conductive polycrystalline silicon (polysilicon). A P+ implantation is then carried out to dope the polysilicon to make it conductive. After the gate trenches have been filled with a layer of conductive polysilicon, conventional fabrication steps which are well known to persons skilled in the art can be used to complete fabrication of the DMOS device without loss of generality. Of course, improved or enhanced processing steps can be used to complete processing of the semi-processed substrates into the desirable devices.

Referring to FIGS. 10 to 16, there are shown Figures illustrating fabrication steps of a DMOS transistor after the trenches have been covered with a thin layer of gate oxide illustrating a second embodiment of the present invention. FIGS. 10–16 show the cross-sectional view along the sectional lines C–C' of FIG. 6.

Figure 10:
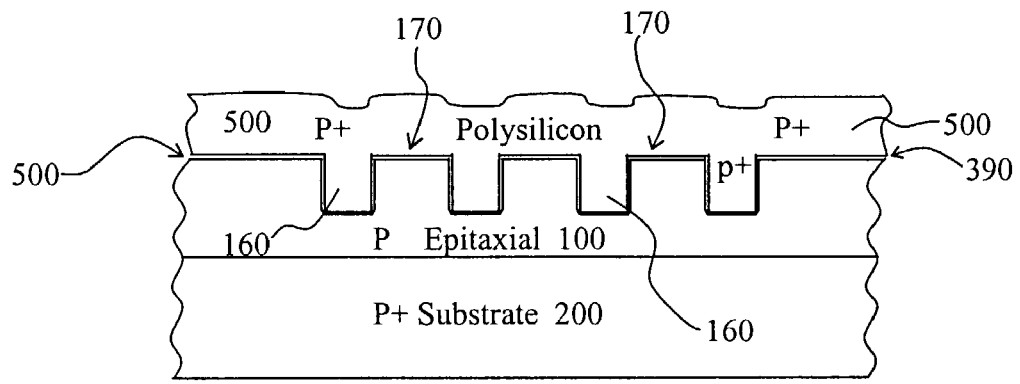
FIGS. 10 to 16 illustrate the fabrication steps of a DMOS transistor after the trenches have been covered with a thin layer of gate oxide illustrating a second embodiment of the present invention.
Figure 11:
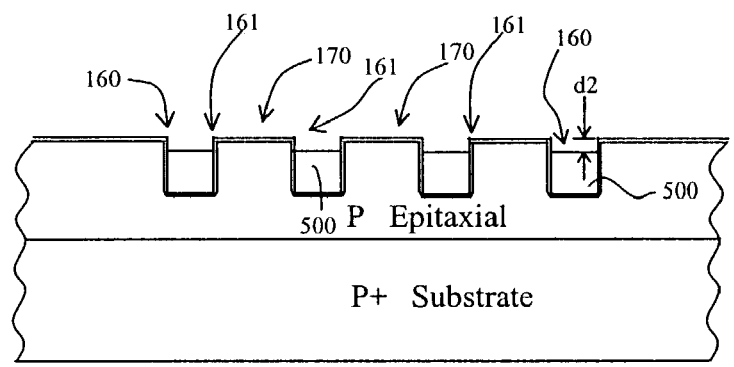

Referring to FIG. 10, the trenches are deposited with polycrystalline silicon 500 which is filled to overflow the trenches 160. The polysilicon is then made conductive by P-type impurity doping, for example, by P+ implantation at a dosage, for example, of about 1E15. The P-type impurity is then subjected to a thermal cycle so that the P-type impurity can be diffused and reach the bottom portion of the trenches. A mask is then used to define the polysilicon gate connection pad and the area at which the polysilicon 500 in the trenches 160 are connected to the gate connection pad. The polysilicon 500 deposited as shown in FIG. 10 is then partially removed, for example, by anisotropic etching, so that the polysilicon 500 is etched back until the top surface of the polysilicon filling is below or recessed from the top edge of the trenches 160 as shown in FIG. 11. It will be noted that the trenches 160 are formed between adjacent substrate surfaces 170 which separate adjacent trenches 160. The top edges or corners 161 represent the transition between the trench 160 and the adjacent substrate surfaces 170. After this polysilicon etching back, the level of the polysilicon 500 in the trenches 160 is at a depth d2 below the P-epitaxial substrate surfaces 170. The depth d2 is usually in the range of 1,000 Å–3,000 Å and is about 2,000 Å in the present example.

Figure 12:
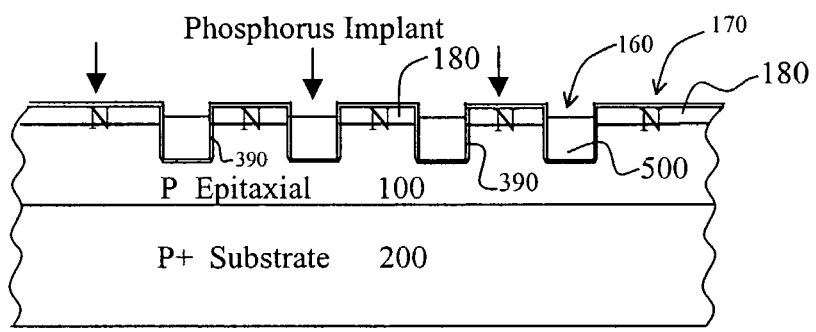
Figure 13:
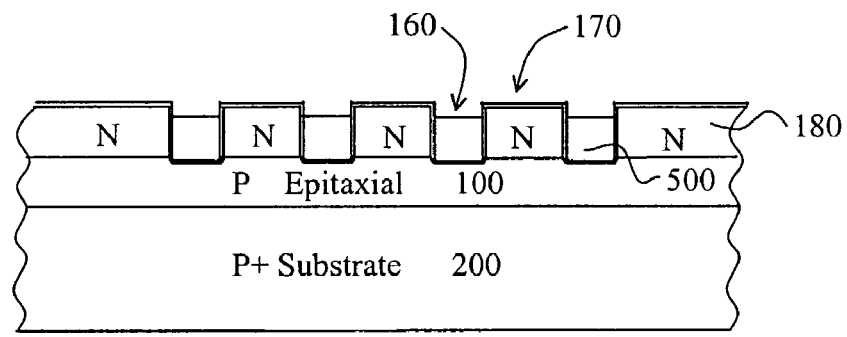

As shown in FIG. 12, a blanket N-type implantation, for example, of phosphorus at a dosage of 1E13, is performed to define the N-body 180. The N-type impurity in the initial N-body 180 is then caused to move deeper towards the P+ substrate 200 by, for example, using a drive-in step to drive the impurities. As shown in FIG. 13, the depth of the N-body 180 does not exceed that of the depth of the trenches 160 in order to sustain a high off-state breakdown voltage.

Figure 14:
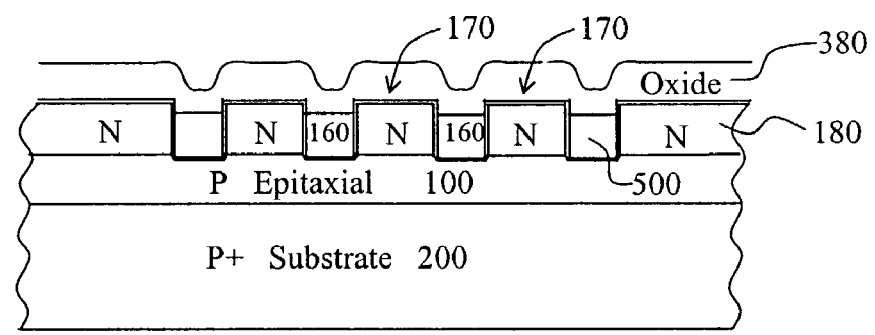
Figure 15:
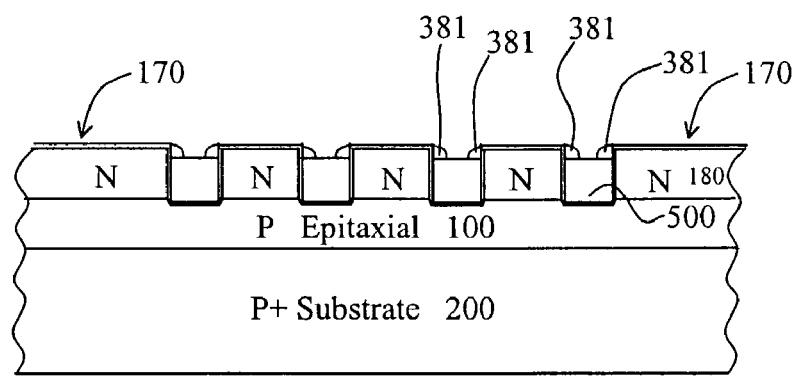

Next, spacing means for covering the portion of the sidewalls of the trenches 160 which are between the top surface of the polysilicon filling 500 and the substrate surfaces 170 are formed to prevent, or at least to alleviate, undesirable penetration of unwanted impurities into the device channel through the trench sidewalls, especially during the high dosage source implantation step. To form the spacing means, a layer of a suitable blocking substance, for example, LPCVD oxide, is deposited on the semi-processed substrate of FIG. 13 and as shown in FIG. 14. The deposited blocking or spacing oxide layer 380 shown in FIG. 14 substantially covers the entire active regions of the substrate and has a sufficient thickness to cater for the subsequent etching back process. After the layer of the blocking or spacing oxide 380 has been deposited, the blocking oxide layer is etched back to create the spacing means, which include spacers 381, extending along the length of the trenches and covering the portions of the trench sidewalls which are above the top surface of the polysilicon 500 and below the substrate surface 170. As the spacers 381 cover a portion of the width of the trench, its thickness along the width of the trench is preferably approximately between 1,000 Å–2,000 Å, and preferably equal to 1,500 Å.

Figure 16:
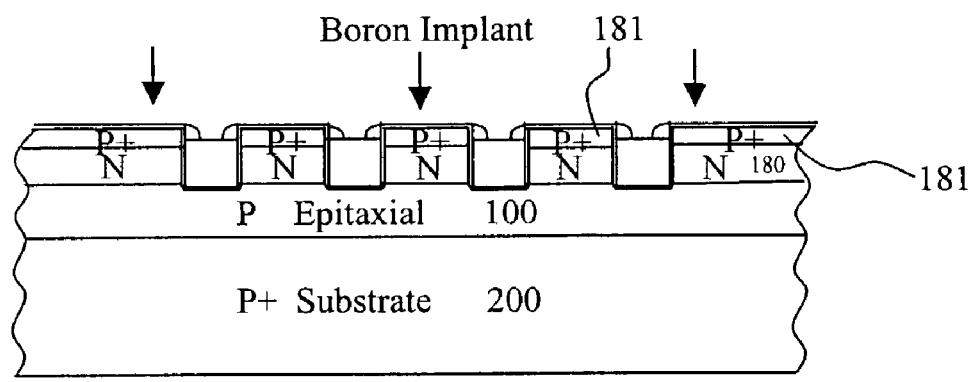

Referring to FIG. 16, a blanket P-type implantation of, for example, boron 5E15, is used to form the P+ source region which is self-aligned to the vertical channel of the device as shown. After the spacing means or spacers 381 have been formed along the portions of the trench sidewalls, conventional, improved or enhanced fabrication steps or processes can be utilized to complete the fabrication of the device without loss of generality.

Figure 17:
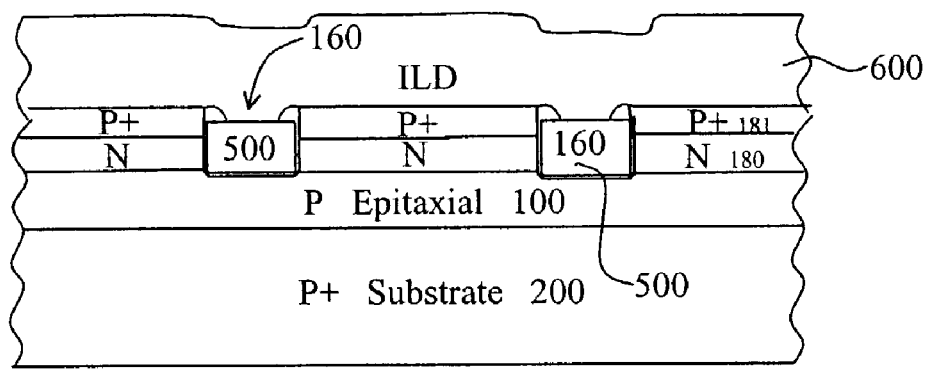
FIG. 17 shows the step illustrating BPSG deposition and high temperature reflow.

For example, after the spacing means have been formed, a blanket P-type implantation of, for example, boron at a concentration 5E15, can be used to form the P+ source region which is self-aligned to the vertical channel as shown in FIG. 16. Next, undoped silicate glass (USG) plus borophosphosilicate glass (BPSG) are deposited as the inter-layer dielectric (ILD) 600. A high temperature process is then used to reflow the BPSG to achieve better planarization and to anneal the source impurities as shown in FIG. 17.

Figure 18:
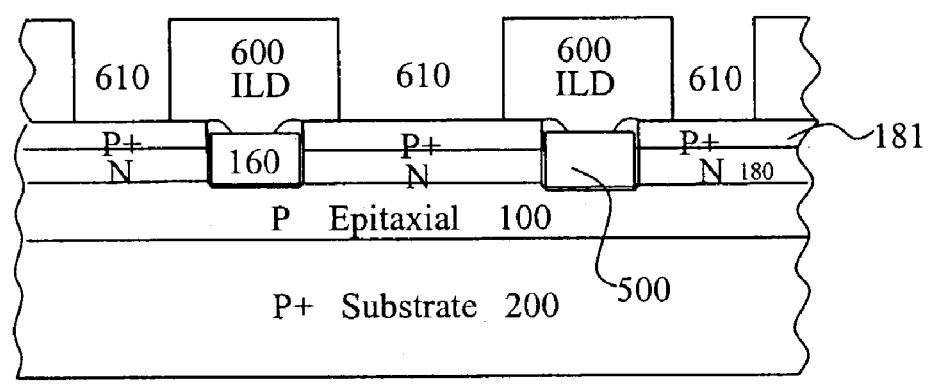
FIGS. 18–21 show fabrication steps illustrating a third embodiment of the invention.

Referring to FIGS. 18 to 21, further fabrication steps illustrating a third embodiment of this present invention are shown. After the inter-layer dielectric 600 has been deposited on the semi-processed substrate, a mask is employed to define the contact regions. Contact holes 610 as shown in FIG. 18 are opened through the ILD layer 600 as shown in FIG. 18 by, for example, anisotropic etching. Next, spacing means are formed along the inside walls along the contact aperture 610.

Figure 19:
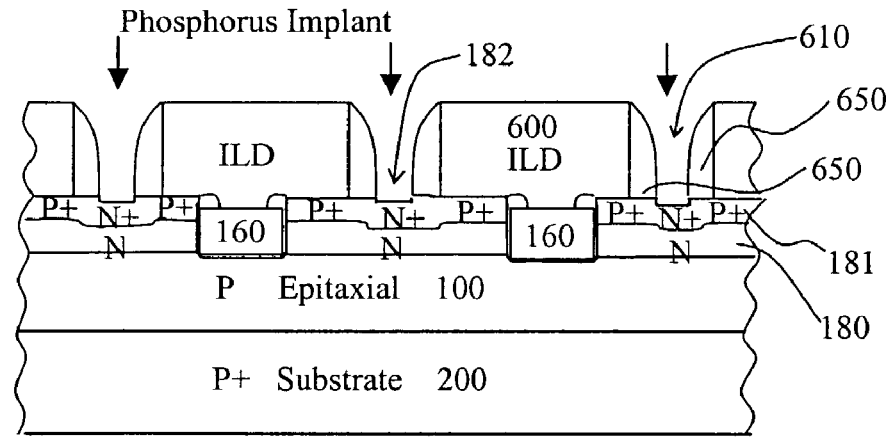
Figure 20:
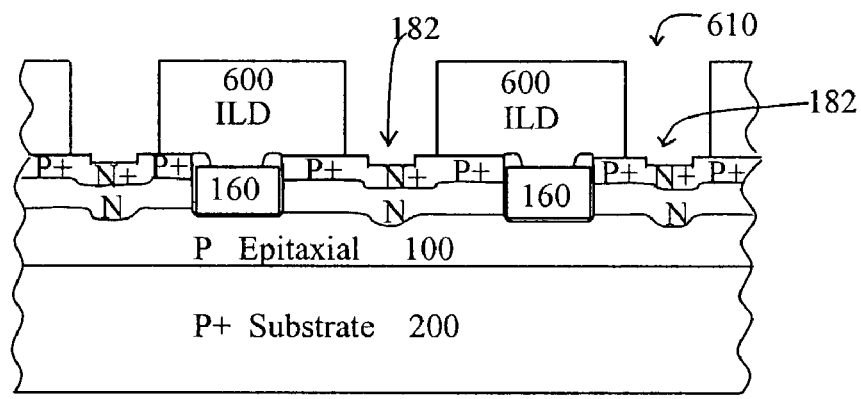
Figure 21:
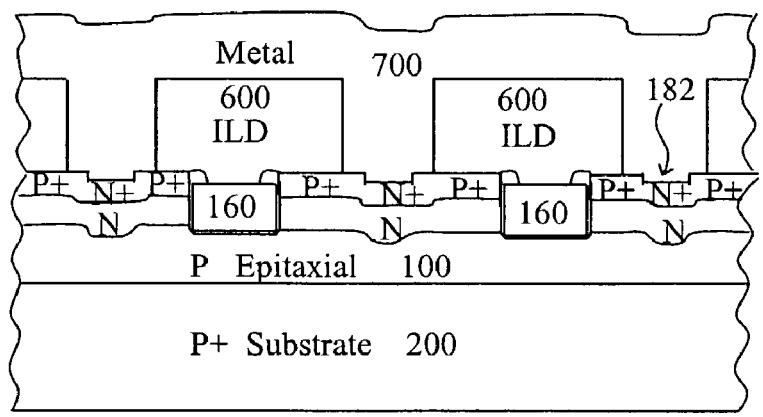

Referring to FIG. 19, the spacing means is formed firstly by depositing a suitable spacing substance, for example, a nitride or oxide of silicon until the ILD layer 600 has been fully covered. The layer of the spacing substance is then etched back by, for example, anisotropic etching, to create a spacer 650 in the contact hole 610. The width of the nitride spacer in this example is about 2,000 Å. In addition, a thickness of silicon is also removed from the surface during this nitride etch-back process. As a result, the portion of the substrate which is exposed after the spacers 650 has been formed is depressed from the main substrate surface. In this example, depression is of a depth of about 2,000 Å. A blanket N+ implantation, for example, by phosphorous at a dosage of 3E15, is performed to the exposed and depressed substrate region to form the N-body contacts 182 as shown in FIG. 19. The nitride spacers 650 are next removed from the contact holes, for example, by hot phosphoric acid $H_3PO_4$. The contact holes are then metallized and filled with a layer of, for example, aluminium, as shown in FIG. 21. Another mask is used to define the source and gate pads.

Figure 23:
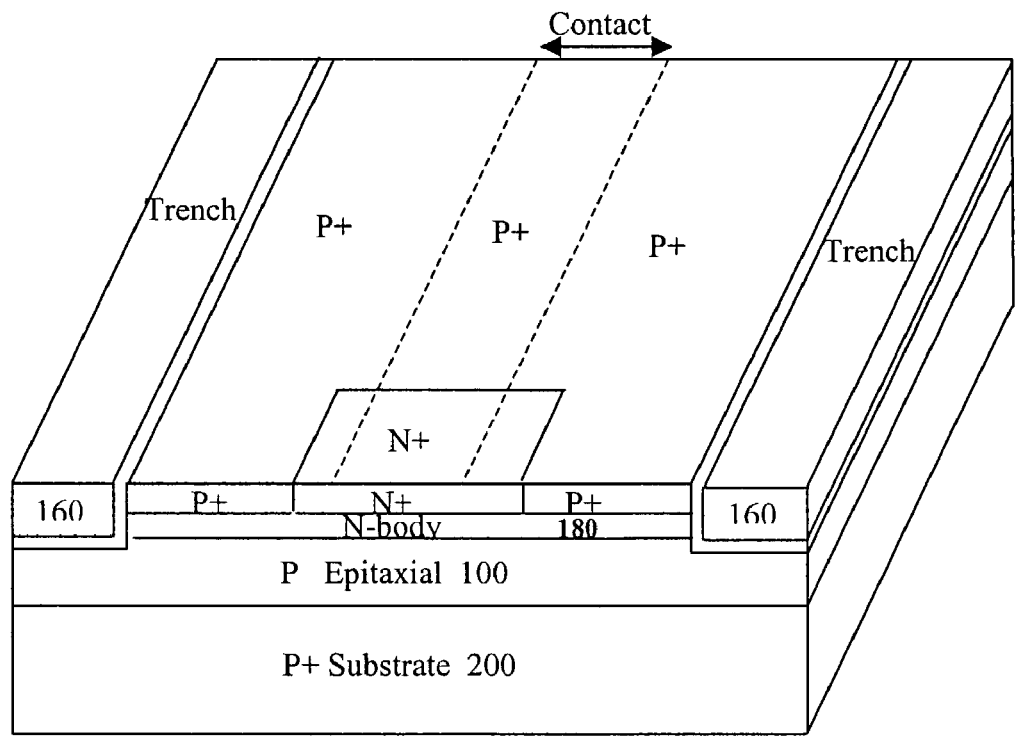
FIG. 23 shows a prior art DMOS device for comparison to that of FIG. 22.

By using this spacer technology, for example, to form spacing means along the inside of the contact holes before the N-body contacts are formed, the width of the N-body contact can be tightly controlled and a very fine and self-aligned N-body contact strip 182 can be formed as shown in FIG. 22. Furthermore, this fine and elongated N-body contact strip 182 can be made into contact with the adjacent P+ source contact strips 181 along a substantial portion of the length of the P source contact strips, thereby enhancing the on-state performance and latch-up immunity. Since the use of this spacing means can be used to accurately define the width of the N-body contact strip, the width of this strip can be tightly controlled to, for example, between 0.1 to 0.3 $\mu$m, thereby facilitating the overall width of the contact strip overlying the N-body and P+ source contact regions to have a width of as small as 0.3 $\mu$m. In general, a range of the overall contact strip width of between 0.3 and 0.5 $\mu$m is characteristic of a DMOS device of this embodiment. In this specific example, the N-body strip width is 0.3 $\mu$m and the contact portion overlying the P+ source contact is 0.1 $\mu$m wide on each side of the N-body region, thereby achieving a total overall contact strip width of about 0.5 $\mu$m along the entire length of the N-body contact and P+ source contact regions. In other words, the use of this spacing means or technology facilities the miniaturization of a DMOS device by facilitating smaller cell pitch in a strip trenched DMOS design compared to the conventional strip trenched DMOS device made according to prior art fabrication processes as shown in FIG. 23 in which the contact between the N-body and the P+ source is only made partially along the length of the trench.

While several embodiments of the present invention have been described above, it should be understood that the processing steps of the embodiments can be used together or separately for the manufacturing of a DMOS device. In other words, the processing steps corresponding to the several embodiments can be used independently or selectively combined as and when appropriate without loss of generality.

While the present invention has been explained by reference to the preferred embodiments described above, it will be appreciated that the embodiments are only provided and illustrated as examples to assist understanding of the present invention and are not meant to restrict or limit the scope of this invention. In particular, the scope and ambit of this invention are to be determined from the general principles taught in this specification with reference to and as inferred or exemplified by the embodiments described above. More particularly, variations or modifications which are obvious or trivial to persons skilled in the art, as well as improvements made on the basis of the present invention, would of course within the scope and boundary of the present invention.

Furthermore, while the present invention has been explained by reference to trenched DMOS devices formed on a P-substrate, it should be appreciated that the invention can apply, whether with or without modifications, to other DMOS devices on a N-substrate without loss of generality. Specifically, an N-channel vertical DMOS transistor structure on an N-substrate can be formed by reversing the various semi-conductor doping and conductivity types without loss of generality.

What is claimed is:

1. A DMOS semiconductor device including a plurality of DMOS transistor cells, each said DMOS transistor cell being formed on a substrate of a first conductivity type and including a body-region of a second conductivity type, said transistor cell including a trench formed on said substrate, said trench having a first longitudinal end, a second longitudinal end and a middle portion interconnecting said first longitudinal end and said second longitudinal end, with a bottom surface of said first and second longitudinal ends being depressed below the bottom surface of said middle portion of said trench, said elongated trench being covered with a layer of insulating substance with said layer of insulating substance at said first and second longitudinal ends of said trench being thicker than along said middle portion of said trench.

2. A DMOS semiconductor device of claim 1, wherein said layer of insulating substance is sandwiched between a layer of conductive substance and the bottom and side surfaces of said trench.

3. A DMOS semiconductor device of claim 2, wherein said conductive substance includes polysilicon and said insulating substance includes an insulative oxide, nitride or like substance.

4. A DMOS semiconductor device of claim 2, wherein the thickness of said layer of insulating substance at said first and second longitudinal ends of said trench exceeds that of the shallower middle portion of said trench by at least 400 Å.

5. A DMOS device of claim 4, wherein a first and a second islands are formed respectively adjacent to said first and said second ends of said trench, said trench being intermediate of said first and said second islands.

6. A DMOS device of claim 5, wherein said first and said second islands protrude above said trench and said body-region.

7. A DMOS semiconductor device comprising a plurality of DMOS transistor cells, each said DMOS transistor cell being formed on a substrate of a first conductivity type and comprising a body-region of a second conductivity type, said DMOS transistor cell including a trench formed on said substrate and having a first longitudinal end, a second longitudinal end and a middle portion interconnecting said first and said second longitudinal ends, the bottom surface of said first and second longitudinal ends being depressed below the bottom surface of said middle portion of said trench, said trench being covered with a layer of insulating substance sandwiched between a layer of conductive substance and the bottom and side surfaces of said trench, the layer of insulating substance at said first and second longitudinal ends of said trench being thicker than along said middle portion of said trench, the thickness of said layer of insulating substance at said first and second longitudinal ends of said trench exceeds that of the shallower middle portion of said trench by at least 400Å, first and second islands formed respectively adjacent first and said second longitudinal ends of said trench, said trench being intermediate said first and said second islands, wherein said first and said second islands are separated from said trench by said body-region.

8. A DMOS semiconductor device comprising a plurality of DMOS transistor cells, each said DMOS transistor cell being formed on a substrate of a first conductivity type and comprising a body-region of a second conductivity type, said DMOS transistor cell including a trench formed on said substrate and having a first longitudinal end, a second longitudinal end and a middle portion interconnecting said first and said second longitudinal ends, the bottom surface of said first and second longitudinal ends being depressed below the bottom surface of said middle portion of said trench, said trench being covered with a layer of insulating substance sandwiched between a layer of conductive substance and the bottom and side surfaces of said trench, the layer of insulating substance at said first and second longitudinal ends of said trench being thicker than along said middle portion of said trench, the thickness of said layer of insulating substance at said first and second longitudinal ends of said trench exceeds that of the shallower middle portion of said trench by at least 400Å, first and second islands formed respectively adjacent first and said second longitudinal ends of said trench, said trench being intermediate said first and said second islands, wherein said first and said second islands are formed from an insulating oxide.

9. A device of claim 1, wherein said first and said second ends of said trench being at least about 400Å deeper than the depth of the shallower middle portion of said trench.

* * * * *